United States Patent
Werner

(10) Patent No.: US 11,117,327 B2
(45) Date of Patent: Sep. 14, 2021

(54) METHOD FOR OPERATING AN APPARATUS FOR ADDITIVELY MANUFACTURING THREE-DIMENSIONAL OBJECTS

(71) Applicant: CONCEPT LASER GMBH, Lichtenfels (DE)

(72) Inventor: Jürgen Werner, Lichtenfels (DE)

(73) Assignee: CONCEPT LASER GMBH, Lichtenfels (DE)

( * ) Notice: Subject to any disclaimer, the term of this patent is extended or adjusted under 35 U.S.C. 154(b) by 261 days.

(21) Appl. No.: 16/277,967

(22) Filed: Feb. 15, 2019

(65) Prior Publication Data

US 2019/0375161 A1    Dec. 12, 2019

(30) Foreign Application Priority Data

Jun. 7, 2018   (EP) ..................................... 18176619

(51) Int. Cl.
*B29C 64/393*     (2017.01)
*B29C 64/268*     (2017.01)
(Continued)

(52) U.S. Cl.
CPC .......... *B29C 64/393* (2017.08); *B29C 64/153* (2017.08); *B29C 64/268* (2017.08);
(Continued)

(58) Field of Classification Search
CPC ........ B22F 10/00; B22F 10/10; B29C 64/153; B29C 64/268; B29C 64/393; B33Y 10/00;
(Continued)

(56) References Cited

U.S. PATENT DOCUMENTS 7,790,093 B2   9/2010  Shkolnik et al.
8,992,816 B2 * 3/2015  Jonasson ............... B29C 64/153
                                                        264/401
(Continued)

FOREIGN PATENT DOCUMENTS

CN   105945280 A   9/2016
EP     2730353 A   5/2014
(Continued)

OTHER PUBLICATIONS

European Search Report Corresponding to Application No. 18176619 dated Dec. 6, 2018.
(Continued)

*Primary Examiner* — Kidest Bahta
(74) *Attorney, Agent, or Firm* — Dority & Manning, P.A.

(57) ABSTRACT

Method for operating an apparatus (1) for additively manufacturing three-dimensional objects (2) by means of successive layerwise selective irradiation and consolidation of layers of a build material (3) which can be consolidated by means of an energy beam (4), wherein at least one part of a first layer (7) is irradiated based on at least one first irradiation parameter and at least one part of a second layer (8) is irradiated based on at least one second irradiation parameter, wherein the at least one first irradiation parameter and the at least one second irradiation parameter are different for the at least two layers (7, 8).

20 Claims, 2 Drawing Sheets

Figure 1:
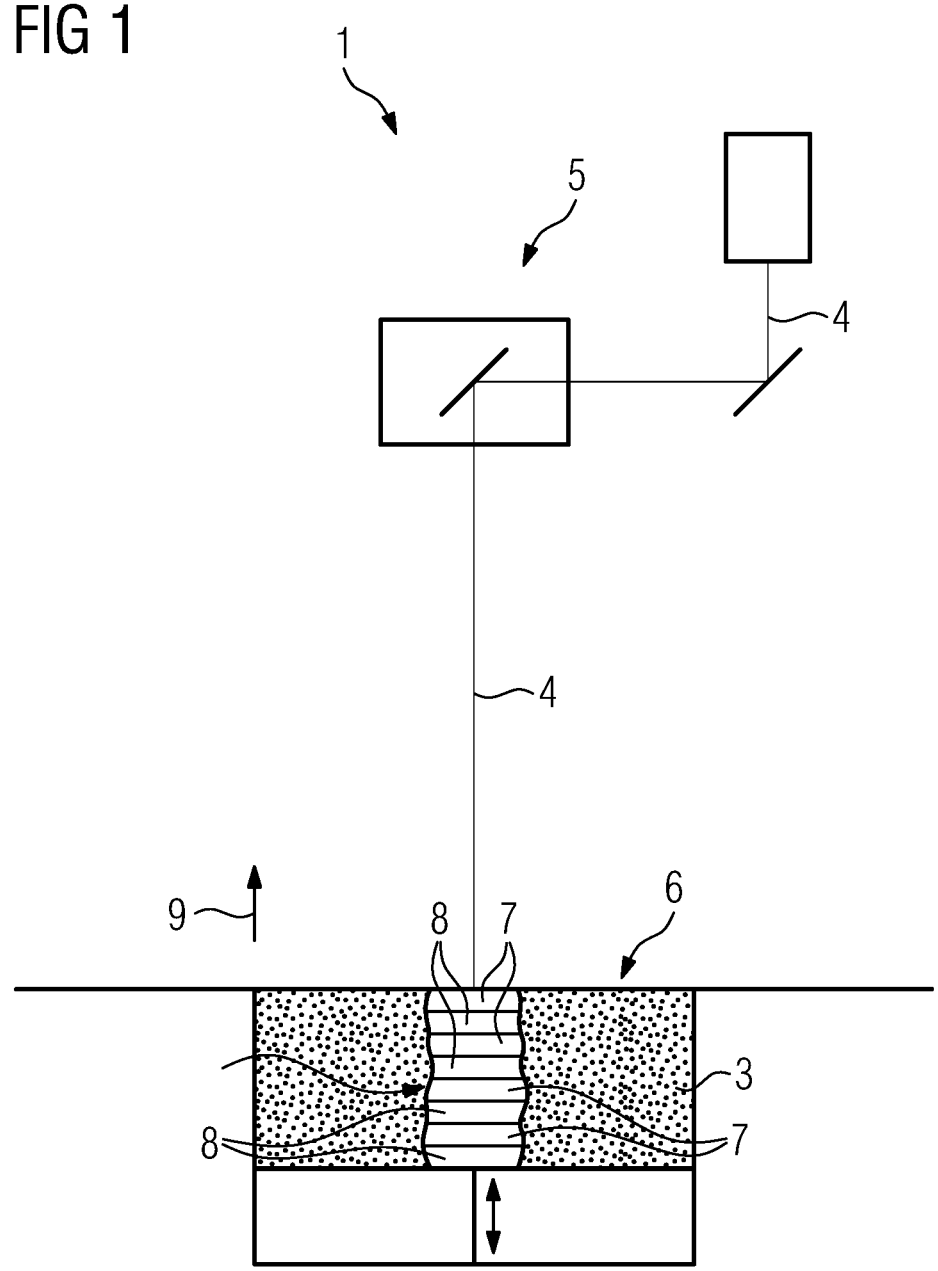

(51) Int. Cl.
  *B29C 64/153* (2017.01)
  *G06F 30/00* (2020.01)
  *B33Y 10/00* (2015.01)
  *B33Y 30/00* (2015.01)
  *B33Y 50/02* (2015.01)

(52) U.S. Cl.
  CPC .............. *G06F 30/00* (2020.01); *B33Y 10/00* (2014.12); *B33Y 30/00* (2014.12); *B33Y 50/02* (2014.12)

(58) Field of Classification Search
  CPC ......... B33Y 30/00; B33Y 50/02; B33Y 80/00; G06F 30/00; Y02P 10/25
  See application file for complete search history.

(56) References Cited

U.S. PATENT DOCUMENTS

| | | | |
|---|---|---|---|
| 2011/0241947 A1* | 10/2011 | Scott | B29C 64/153 343/700 MS |
| 2014/0140882 A1* | 5/2014 | Syassen | B33Y 30/00 419/53 |
| 2014/0295087 A1 | 10/2014 | Rickenbacher et al. | |
| 2015/0084240 A1* | 3/2015 | Shuck | B29C 64/218 264/489 |
| 2015/0367446 A1* | 12/2015 | Buller | H05B 6/80 219/74 |
| 2016/0332379 A1 | 11/2016 | Paternoster et al. | |
| 2017/0189965 A1 | 7/2017 | Vaidya et al. | |
| 2017/0197249 A1 | 7/2017 | Versluys et al. | |
| 2018/0207871 A1 | 7/2018 | Miki et al. | |

FOREIGN PATENT DOCUMENTS

| | | |
|---|---|---|
| JP | H0671761 A | 3/1994 |
| JP | 2001/277368 A | 10/2001 |
| JP | 2002/001827 A | 1/2002 |
| WO | WO2017/207127 A1 | 12/2017 |

OTHER PUBLICATIONS

Machine Translated Japanese Search Report Corresponding to Application No. 2019107217 dated Nov. 9, 2020.

* cited by examiner

METHOD FOR OPERATING AN APPARATUS FOR ADDITIVELY MANUFACTURING THREE-DIMENSIONAL OBJECTS

CROSS-REFERENCE TO RELATED APPLICATIONS

This application claims priority to European Patent Application serial no. 18 176 619.7 filed Jun. 7, 2018, the contents of which is incorporated herein by reference in its entirety as if set forth verbatim.

The invention relates to a method for operating an apparatus for additively manufacturing three-dimensional objects by means of successive layerwise selective irradiation and consolidation of layers of a build material which can be consolidated by means of an energy beam.

Such apparatuses for additively manufacturing three-dimensional objects and methods for operating the same are generally known from prior art. Usually, the build material, for example a metallic powder, is applied in a build plane and can be selectively irradiated via an energy beam to selectively consolidate the build material and thereby successively form the three-dimensional object.

Further, it is known from prior art that often a compromise has to be found regarding the adjustment of the irradiation parameters, such as the power or the intensity of the energy beam. As different parts of the object show different properties or different properties of different parts of the object are desired, such as a surface quality or a consolidation behavior of different parts of the object, such as core parts or shell parts, filigree structures and the like, different irradiation parameters are required. Typically, an irradiation parameter is adjusted with which all the different structures or parts of the object can be irradiated. Hence, the irradiation of the various parts or structures of the object is not performed based on an optimum parameter for the individual parts, but the adjusted irradiation parameter is a compromise between the individual requirements.

Alternatively, it is known that for each part or structure of the object an individual (optimum) irradiation parameter is used to irradiate the build material, wherein disadvantageously the overall manufacturing time increases, as each part or structure of the object has to be irradiated with the individual irradiation parameter and therefore, the individual structures and/or parts of the object cannot be irradiated in the same irradiation step, i.e. with the same energy beam that is generated based on the same irradiation parameter.

It is an object of the present invention to provide a method for operating an apparatus for additively manufacturing three-dimensional objects, wherein the irradiation of build material is improved, in particular the requirements of different structures or parts of the object can be taken into calculation and the manufacturing time can be reduced.

The object is inventively achieved by a method according to claim 1. Advantageous embodiments of the invention are subject to the dependent claims.

The method described herein is a method for operating an apparatus for additively manufacturing three-dimensional objects, e.g. technical components, by means of successive selective layerwise consolidation of layers of a powdered build material ("build material") which can be consolidated by means of an energy beam, in particular a laser beam or an electron beam. A respective build material can be a metal, ceramic or polymer powder. A respective energy beam can be a laser beam or an electron beam. A respective apparatus can be an apparatus in which an application of build material and a consolidation of build material is performed separately, such as a selective laser sintering apparatus, a selective laser melting apparatus or a selective electron beam melting apparatus, for instance.

The apparatus may comprise a number of functional units which are used during its operation. Exemplary functional units are a process chamber, an irradiation device which is adapted to selectively irradiate a build material layer disposed in the process chamber with at least one energy beam, and a stream generating device which is adapted to generate a gaseous fluid stream at least partly streaming through the process chamber with given streaming properties, e.g. a given streaming profile, streaming velocity, etc. The gaseous fluid stream is capable of being charged with non-consolidated particulate build material, particularly smoke or smoke residues generated during operation of the apparatus, while streaming through the process chamber. The gaseous fluid stream is typically inert, i.e. typically a stream of an inert gas, e.g. argon, nitrogen, carbon dioxide, etc.

As described before, the invention relates to a method for operating an apparatus for additively manufacturing three-dimensional objects, wherein build material is selectively irradiated with an energy beam. The invention is based on the idea that at least one part of a first layer is irradiated based on at least one first irradiation parameter and at least one part of a second layer is irradiated based on at least one second irradiation parameter, wherein the at least one first irradiation parameter and the at least one second irradiation parameter are different for the at least two layers.

According to the invention, it is possible to perform the irradiation of two layers, e.g. the first layer and the second layer, based on the first irradiation parameter and the second irradiation parameter, wherein the first irradiation parameter and the second irradiation parameter differ. Thus, it is possible to layerwise vary the irradiation process in terms of the irradiation parameter based on which the irradiation process is performed. In other words, it is not necessary to choose a single irradiation parameter or parameter set, respectively, and perform the irradiation process, i.e. irradiate build material to selectively consolidate build material in all parts or all structures of the object, based on the chosen parameter set.

Thus, it is not necessary to adjust a single irradiation parameter or parameter set as a compromise in terms of the irradiation of different parts of different structures of the three-dimensional object. Instead, a first irradiation parameter can be chosen with regard to the requirements of at least one first part or structure of the object, wherein at least one second irradiation parameter can be chosen for at least one second part or structure of the object. By irradiating the first layer based on the first irradiation parameter and irradiating the second layer based on the second irradiation parameter, the requirements of the first part or structure are fulfilled when irradiating the first layer and the requirements of the second part or structure are fulfilled when irradiating the second layer. Hence, it is possible to irradiate the individual layers with the first or the second irradiation parameter (set) and therefore, irradiate each layer in one irradiation step, wherein it is ensured that the different structures or parts of the object are properly irradiated, as the different irradiation parameters (sets), e.g. ideal parameters for the different structures, are used to perform the irradiation processes in the first or the second layer.

The term "irradiation parameter" in the scope of this application may also relate to an "irradiation parameter set", i.e. a plurality of parameters contributing or influencing the irradiation process. Hence, it is possible that for two different irradiation steps two different irradiation parameter sets are used, wherein the two irradiation parameter sets differ for example in one or more irradiation parameters.

According to a first embodiment of the invention, the irradiation parameter may comprise a position of the contour of the object, wherein the contour is positioned differently for at least two layers. According to this embodiment, the irradiation parameter, i.e. the first irradiation parameter and the second irradiation parameter, comprise positions of the contour of the object for the specific layer the irradiation parameter is used to perform the irradiation process.

The contour of the object in the scope of this embodiment describes the position of the contour or the edge of the layer or the cross-section of the object in this specific layer, for instance. By varying the position of the contour, it is possible to enhance the surface quality of the three-dimensional object that is built in the additive manufacturing process. For example, it is possible to define a first position of the contour in the first irradiation parameter and a second position of the contour of the object in the second irradiation parameter. By irradiating build material in a first layer based on the first irradiation parameter and irradiating build material in the second layer based on the second irradiation parameter, the position of the contour of the object also varies between the first layer and the second layer of the object.

The irradiation parameter, i.e. the first irradiation parameter and the second irradiation parameter, may relate to an intensity and/or a power of the energy beam, wherein at least one part of the first layer and the second layer are irradiated with a different intensity and/or a power and/or a spot size and/or a spot diameter and/or beam path for the at least two layers. As described before, the term "irradiation parameter" in the scope of this application may refer to a single irradiation parameter, such as the intensity of the energy beam and/or the power of the energy beam or a position of an irradiation pattern generated in the build plane, as described before, wherein it is also possible that the term "irradiation parameter" refers to a set of irradiation parameters that is used in the corresponding irradiation process. For example, it is possible that each irradiation parameter set, i.e. a first irradiation parameter set and a second irradiation parameter set comprise an arbitrary number of irradiation parameters, for example the intensity of the energy beam, the spot size, the beam path and the like, wherein the first irradiation parameter set and the second irradiation parameter set may differ in at least one of those irradiation parameters.

By influencing or adjusting the corresponding irradiation parameters or at least one irradiation parameter, respectively, it is possible to influence the amount of energy that is deposited in the build material and/or adjust the position of the irradiation pattern in which the energy is deposited in the build material. For example, it is possible to adjust the amount of energy deposited in the build material dependent on the part of the object or the structure of the object in the respective position, for example different for filigree structures or core parts of the object and the like.

The inventive method may further be improved in that at least a first group of layers and a second group of layers are formed, wherein each group comprises at least one layer, wherein the first group of layers is irradiated based on at least one first irradiation parameter and the second group of layers is irradiated based on at least one second irradiation parameter. Thus, the layers that form the three-dimensional object can be assigned to at least one first group and at least one second group, wherein each group of layers comprises at least one layer. The single layers of each group can be arbitrarily distributed over the object, i.e. form arbitrary parts of the object, wherein it is explicitly not necessary that all layers of the first group or the second group are arranged in succession, but it is also possible that, for example, a layer of the first group is enclosed in building direction between two layers of the second group or any other arbitrary combination or distribution of layers.

Assigning individual layers to different groups of layers allows for adjusting the irradiation parameter or the irradiation parameter set the irradiation process for those layers is based on. For example, the part of the object or the structure of the object that is formed in a corresponding layer can be taken into calculation in that the corresponding layer can be assigned to a corresponding group of layers that is irradiated with a suitable irradiation parameter.

Further, the first group of layers and the second group of layers may be distributed over the object in a predefined pattern, in particular alternatingly. The predefined pattern defines the distribution or the sequence of the individual layers of the first group of layers and the second group of layers over the object. For example, the first group of layers and the second group of layers may be distributed alternatingly over the object, wherein for example, a first layer of the first group of layers is followed by a first layer of the second group of layers which is again followed by a second layer of the first group of layers and so on. Thus, the irradiation process can be performed alternatingly based on the at least one first irradiation parameter and the at least one second irradiation parameter. Of course, it is also possible to define an arbitrary number of groups of layers, for example three, four or more groups of layers and correspondingly, third irradiation parameters, fourth irradiation parameters and so on.

According to another embodiment of the inventive method, the first group of layers may comprise the even numbers of layers of the object and the second group of layers may comprise the odd numbers of layers or vice versa. Thus, an alternating irradiation based on the first irradiation parameter or the second irradiation parameter can be performed by assigning the odd numbers of layers to the second group of layers and even numbers of layers to the first group of layers or vice versa.

The first group of layers and/or the second group of layers may comprise at least two succeeding layers. As described before, the individual layers of the object can be distributed arbitrarily and can be assigned arbitrarily to the at least one first group and the at least one second group of layers. According to this embodiment, the first group of layers and/or the second group of layers may comprise layers, wherein at least two of those layers succeed each other. Of course, the number of succeeding layers can also be chosen arbitrarily. In particular, it is possible that the first group of layers comprises a defined number of layers, wherein at least two layers succeed each other and other layers are arranged alternatingly with layers of the second group of layers and vice versa or in combination, for instance.

According to another exemplary embodiment of the inventive method, at least one part of a contour of a first layer of the first group of layers is irradiated on a first position with a first energy input and at least one corresponding part of a contour of a second layer of the second group of layers is irradiated on a second position with a second energy input, wherein the first energy input and the second energy input and/or the first position and the second position differ.

According to another exemplary embodiment of the inventive method, at least one part of a contour of a first layer of a first group of layers is irradiated on a first position with a first parameter set, particularly relating to an intensity and/or a power of the energy beam, and/or spot size and/or spot diameter and/or beam path, and at least one corresponding part of a contour of a second layer of the second group of layers is irradiated on a second position with a second parameter set, particularly relating to an intensity and/or a power of the energy beam, and/or spot size and/or spot diameter and/or beam path, wherein the first parameter set and the second parameter set and/or the first position and the second position differ.

According to another exemplary embodiment of the inventive method, at least one part of the contour of the first layer of the first group of layers is irradiated on a first position with a first power and at least one corresponding part of the contour of the second layer of the second group of layers is irradiated on a second position with a second power, wherein the first power and the second power and/or the first position and the second position differ. Thus, it is possible to define a first irradiation parameter for the first group of layers, as described before, wherein at least one part of the contour of the object can be irradiated based on the first power (or intensity) of the energy beam for the first layer that is assigned to the first group of layers. A corresponding part of the contour of the object is assigned to a second layer of the second layer group or the second group of layers, respectively, wherein the corresponding part of the contour of the second layer is irradiated on a second position with a second power (or intensity) of the energy beam.

The first power and the second power of the energy beam and/or or the first position and the second position of the first layer and the second layer or the first part of the contour of the object and the second part of the contour of the object differ. As described before, it is possible to assign an arbitrary number of layers to the first group of layers and the second group of layers, wherein each layer may comprise a part of the contour of the object. For example, the first layers of the first group of layers and the second layers of the second group of layers can be arranged in an alternating distribution in build direction, wherein the contour of the object may be irradiated in a first position in the first layers and in a second position in the second layers. Also it is additionally or alternatively possible that in the irradiation process performed for the first layers a first power of the energy beam is used, wherein in the irradiation process of the second layers a second power of the energy beam is used.

For example, a cylindrical object can be irradiated by (slightly) varying the power and/or or the position of the contour of the object allowing for an improvement of various parameters of the object, such as mechanical properties and/or or the surface quality of the object. The term "build direction" may refer to the direction in which the layerwise application and consolidation of layers of the build material is formed, i.e. the direction in which the object is additively built.

Besides, the invention relates to an apparatus for additively manufacturing three-dimensional objects by means of successive layerwise selective irradiation and consolidation of layers of a build material which can be consolidated by means of an energy beam, which apparatus comprises an irradiation device that is adapted to generate and guide the energy beam across a build plane in which a layer of build material is applied, wherein the irradiation device is adapted to irradiate at least one part of a first layer based on at least one first irradiation parameter and at least one part of a second layer based on at least one second irradiation parameter, wherein the at least one first irradiation parameter and the at least one second irradiation parameter are different for the at least two layers.

The apparatus may comprise a corresponding control unit to perform the inventive method, as described before. The control unit may be a separate control unit that may be connected or connectable with the irradiation device, for instance, or the control unit may be an internal control unit of the apparatus, in particular a control unit of the irradiation device. The control unit may generate or receive the irradiation data comprising the individual layers of the object. The irradiation device may be adapted to irradiate at least one part of a contour of a first layer of the first group of layers on a first position with a first energy input and at least one corresponding part of a contour of a second layer of the second group of layers is irradiated on a second position with a second energy input, wherein the first energy input and the second energy input and/or the first position and the second position differ.

The irradiation device may be further adapted to irradiate at least one part of a contour of a first layer of a first group of layers on a first position with a first parameter set, particularly relating to an intensity and/or a power of the energy beam, and/or spot size and/or spot diameter and/or beam path, and at least one corresponding part of a contour of a second layer of the second group of layers is irradiated on a second position with a second parameter set, particularly relating to an intensity and/or a power of the energy beam, and/or spot size and/or spot diameter and/or beam path, wherein the first parameter set and the second parameter set and/or the first position and the second position differ.

Further, the irradiation device may be adapted to irradiate at least one part of the first layer based on the at least one first irradiation parameter and the at least one part of the second layer based on the at least one second irradiation parameter, wherein the first and the second irradiation parameter differ for the at least two layers, i.e. the at least one first layer and the at least one second layer. This allows for taking the different parts or structures of the object into calculation, as different irradiation parameters may be used to perform the irradiation process. As, for example, the first layers of the object are irradiated based on the first irradiation parameter and the second layers are irradiated based on the second irradiation parameter it is possible that all parts of the object, for example contour parts or filigree structures of the object and core parts of the object, such as massive structures of the object can be irradiated with optimal irradiation parameters, wherein the manufacturing time can be reduced, as each layer can be irradiated based on the corresponding irradiation parameter without the need for changing the irradiation parameter in an irradiation step for irradiating the corresponding layer.

According to another embodiment of the inventive apparatus, the irradiation parameter may comprise a position of the contour of the object, wherein the irradiation device may be adapted to position the same part of the contour differently for at least two layers. Hence, the contour of the object as defined by several layers of the object may be positioned (slightly) differently for at least two layers assigned to the first group of layers and the second group of layers, in particular succeeding layers.

The irradiation parameter, i.e. the first irradiation parameter and the second irradiation parameter, may relate to an intensity and/or a power of the energy beam, wherein the irradiation device may be adapted to irradiate at least one part of the first layer and a second layer with a different intensity and/or a different power and/or a different spot size and/or a different spot diameter and/or along a different beam path of the energy beam. Thus, the energy that is deposited in the build material, i.e. the irradiation pattern generated via the irradiation device can be adjusted differently for the at least two layers of build material to be irradiated that are assigned to the first group of layers and the second group of layers.

As described before, the distribution of the layers of the first group of layers and the second group of layers can be chosen arbitrarily. According to an advantageous embodiment of the inventive apparatus, the irradiation device may be adapted to distribute the first group of layers or a second group of layers over the object in a predefined pattern, in particular alternatingly. Therefore, it is possible to perform the irradiation parameters with varying irradiation parameters, wherein layers of the first group of layers can be irradiated based on the first irradiation parameter and the second group of layers can be irradiated based on the second irradiation parameter, wherein the layers of the first group of layers and layers of the second group of layers are arranged alternatingly in build direction. In other words, a first layer may be irradiated based on the first irradiation parameter and the succeeding second layer which is assigned to the second group of layers may be irradiated based on the second irradiation parameter and so on. Of course, the number of groups of layers and the number of layers can be chosen arbitrarily.

According to another preferred embodiment it is possible that the first group of layers comprise the even numbers of layers of the object and the second group of layers may comprise the odd numbers of layers or vice versa. As described before, the assignment of layers to the first group of layers and the second group of layers is generally arbitrary, wherein the first group of layers may comprise all even numbers of layers, such as the second, fourth, sixth and so on, layers of the object, wherein the second group of layers may comprise the odd numbers of layers, such as the first, third, the fifth and so on, numbers of layers of the object. Of course, it is also possible to define the first group of layers comprising the odd numbers and the second group of layers comprising the even numbers of layers, for instance.

The inventive apparatus can further be improved in that the irradiation device may be adapted to irradiate at least one part of the contour of the first layer of the first group of layers in a first position with a first power of the energy beam and at least one corresponding part of the contour of the second layer of the second group of layers on a second position with a second power of the energy beam, wherein the first power and the second power and/or the first position and the second position are different. Thus, the inventive apparatus, in particular the irradiation device of the inventive apparatus, allows for irradiating the layers of the first group of layers and the second group of layers differently. The irradiation process that is performed for irradiating the first layers of the first group of layers and the second layers of the second group of layers may differ in the irradiation parameters based on which the irradiation process is performed, wherein it is possible to irradiate the contour of the object in the first layers on a different position and/or with a different power compared with the second layers or, in particular, the part of the contour of the second layers of the second group of layers.

The invention further relates to a hardware- and/or software embodied control unit for an apparatus for additively manufacturing three-dimensional objects by means of successive layerwise selective irradiation and consolidation of layers of a build material which can be consolidated by means of an energy beam. The control unit is configured, particularly in accordance with a method according to any or the preceding Claims, to control irradiating at least one part of a first layer based on at least one first irradiation parameter and control irradiating at least one part of a second layer based on at least one second irradiation parameter, wherein the at least one first irradiation parameter and the at least one second irradiation parameter are different for the at least two layers.

All features, details and advantages described with respect to the inventive method can fully be transferred to the inventive apparatus and to the control unit and vice versa.

Figure 2:
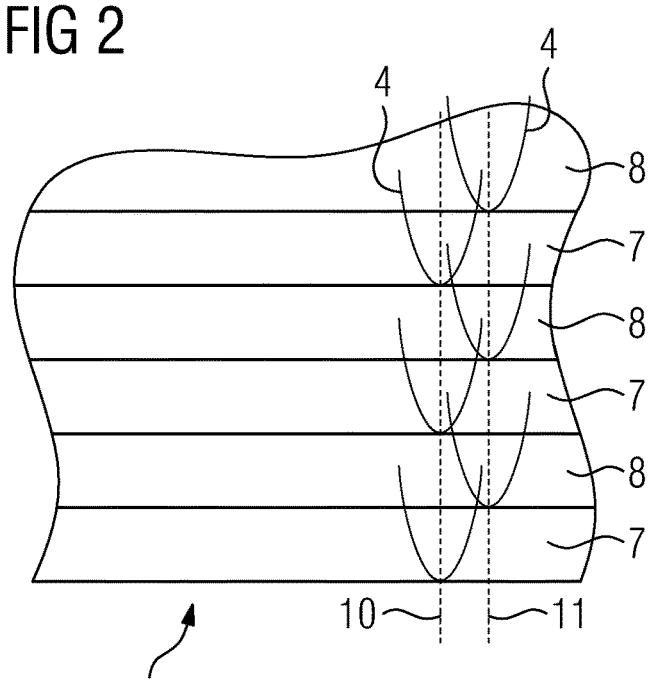
Figure 3:
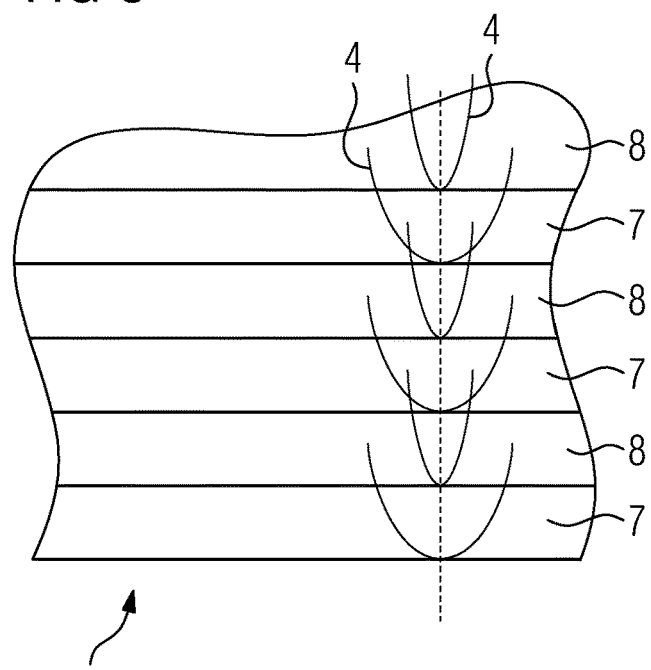

Exemplary embodiments of the invention are described with reference to the FIG. The FIG. are schematic diagrams, wherein FIG. 1 shows an inventive apparatus;

FIG. 2 shows irradiation processes of the inventive method according to a first exemplary embodiment; and FIG. 3 shows irradiation processes of the inventive method according to a second exemplary embodiment.

FIG. 1 shows an apparatus 1 for additively manufacturing three-dimensional objects 2 by means of successive layerwise selective irradiation and consolidation of layers of a build material 3 which can be consolidated by means of an energy beam 4. The apparatus 1 comprises an irradiation device 5 that is adapted to generate and guide the energy beam 4 across a build plane 6 in which a layer of build material 3 is applied. The irradiation device 5 is further adapted to irradiate at least one part of a first layer 7 based on at least one first irradiation parameter and at least one part of a second layer 8 based on at least one second irradiation parameter, wherein the at least one first irradiation parameter and the at least one a second irradiation parameter are different for the at least two layers 7, 8.

The irradiation parameter may comprise a position of a contour of the object 2, wherein the irradiation device 5 is adapted to position the same part of the contour differently for the at least two layers 7, 8. The irradiation parameter, i.e. the first irradiation parameter and the second irradiation parameter relate to an intensity/power of the energy beam 4. The irradiation device 5 is adapted to irradiate at least one part of the first layer 7 and the second layer 8 with a different intensity/power, for example using a different spot size and/or a different spot diameter and/or a different beam path. Hence, the energy that is deposited in a corresponding region of the layers 7, 8 and the position of the corresponding region can be varied regarding the irradiation processes of the at least two layers 7, 8.

In this exemplary embodiment that is depicted in FIGS. 1-3, The object 2 is subdivided into first layers 7 assigned to a first group of layers and second layers 8 assigned to a second group of layers. The first layers 7 of the first group of layers and the second layers 8 of the second group of layers are arranged or distributed alternatingly over the object 2 in build direction 9 (optional). The build direction 9, as described before, refers to the direction in which the layerwise application and irradiation of build material 3, i.e. the manufacturing of the object 2 is performed. Of course, the alternating arrangement of the layers 7, 8 is merely exemplary and any other arbitrary way of arranging the layers 7, 8 is feasible.

FIG. 2 shows an irradiation process or irradiation processes according to the inventive method, wherein the position of the beam path the energy beam 4 is guided along is varied regarding the irradiation of the first layers 7 and the second layers 8. The first irradiation parameter the first irradiation process is based on, i.e. based on which the irradiation of the first layers 7 is performed, comprises a first position 10 of the energy beam 4 for the respective part, for example a part of the contour of the object 2. When irradiating the same structure in the second layers 8, the energy beam 4 is guided along a (slightly) different beam path in that the energy beam 4 is incident on a second position 11. For example, the positions 10, 11 slightly differ in that the contour of the object 2 slightly differs in position while irradiating the different layers 7, 8. The irradiation process that is performed based on different positions between the layers 7, 8 enhances the surface quality of the object 2.

FIG. 3 shows a second embodiment of an irradiation process based on the inventive method, wherein the first layers 7 and the second layers 8 are irradiated using different irradiation parameters, in particular a different intensity of the energy beam 4. For instance, a different spot diameter of the energy beam 4 is used for the irradiation processes for irradiating the first layers 7 and the second layers 8. In this exemplary embodiment, a larger spot size is used when irradiating the first layers 7 compared with the spot size of the energy beam 4 when irradiating the second layers 8. Again, an alternating distribution of the first layers 7 and the second layers 8 is chosen, wherein it is arbitrary to choose another arrangement for example use two succeeding second layers 8 alternating with one first layers 7. It is also possible to assign third layers to a third group of layers (not shown), for instance. By adjusting the power or the intensity of the energy beam 4 differently for the at least two layers 7, 8 assigned to different groups of layers it is possible to irradiate different structures of the object 2 with optimal parameters, wherein the irradiation parameters do not have to be changed during one irradiation step, in particular during the irradiation of the same layer. Thus, it is possible to irradiate the first layers 7 based on the first irradiation parameter or first irradiation parameter set, whereas the second layers 8 may be irradiated using a second irradiation parameter or a second irradiation parameter set.

Of course, the embodiments described with respect to the individual FIG. can arbitrarily combined. In particular, it is possible to vary multiple irradiation parameters when irradiating the first and the second layers 7, 8. For example, the position and the intensity of the energy beam 4 can be varied between the irradiation processes for the layers 7, 8.

The invention claimed is:

1. A method of additively manufacturing a three-dimensional object, the method comprising:
    irradiating a first plurality of layers of a build material to form a first portion an object in accordance with an irradiation parameter set comprising a plurality of irradiation parameters, wherein respective ones of the plurality of irradiation parameters respectively exhibit a first parameter value with respect to the first plurality of layers; and
    irradiating a second plurality of layers of the build material to form a second portion of the object in accordance with the irradiation parameter set comprising the plurality of irradiation parameters, wherein respective ones of the plurality of irradiation parameters respectively exhibit a second parameter value with respect to the second plurality of layers;
    wherein the first plurality of layers and the second plurality of layers are distributed in an alternating sequence across a height of the object, the alternating sequence comprising respective ones of the first plurality of layers followed by a respective one of the second plurality of layers; and
    wherein the first parameter value differs from the second parameter value in respect of at least one of the plurality of irradiation parameters, wherein the plurality of irradiation parameters comprises: beam path, beam intensity and/or beam power.

2. The method of claim 1, wherein the irradiation parameter comprises: a position of a contour of the object, wherein the first parameter value comprises a first position of the contour and the second parameter value comprises a second position of the contour.

3. The method of claim 1, wherein irradiating the first plurality of layers comprises, with respect to respective ones of the first plurality of layers, irradiating a first contour at a first position, and wherein irradiating the second plurality of layers comprises, with respect to respective ones of the second plurality of layers, irradiating a second contour at a second position, wherein the second position differs from the first position.

4. The method of claim 3, wherein the second position partially overlaps the first position.

5. The method of claim 1, wherein irradiating the first plurality of layers comprises, with respect to respective ones of the first plurality of layers, irradiating a first contour at a first position, the first position having a first energy input, and wherein irradiating the second plurality of layers comprises, with respect to respective ones of the second plurality of layers, irradiating a second contour at a second position, the second position having a second energy input, wherein the second energy input differs from the first energy input.

6. The method of claim 5, wherein the second position differs from the first position.

7. The method of claim 6, wherein the second position partially overlaps the first position.

8. The method of claim 1, wherein respective ones of the plurality of irradiation parameters respectively exhibit an initial first parameter value with respect to a first region of the object, and wherein respective ones of the plurality of irradiation parameters respectively exhibit a subsequent first parameter value with respect to a second region of the object, wherein the initial first parameter value differs from the subsequent first parameter value in respect of at least one of the plurality of irradiation parameters.

9. The method of claim 8, wherein the first region of the object comprises a first structure of the object, and wherein the second region of the object comprises a second structure of the object.

10. The method of claim 8, wherein the first region of the object comprises a filigree structure and/or wherein the second region of the object comprises a core region.

11. The method of claim 8, wherein the initial first parameter value is determined based at least in part on a physical requirement of the first region of the object, and/or wherein the subsequent first parameter value is determined based at least in part on a physical requirement of the second region of the object.

12. The method of claim 11, wherein the physical requirement of the first region of the object comprises a first value for a mechanical property and/or a surface quality, and/or wherein the physical requirement of the second region of the object comprises a second value for the mechanical property and/or the surface quality.

13. The method of claim 8, wherein respective ones of the plurality of irradiation parameters respectively exhibit an initial second parameter value with respect to a first region of the object, and wherein respective ones of the plurality of irradiation parameters respectively exhibit a subsequent second parameter value with respect to a second region of the object, wherein the initial second parameter value differs from the subsequent second parameter value in respect of at least one of the plurality of irradiation parameters.

14. The method of claim 13, wherein the initial second parameter value is determined based at least in part on a physical requirement of the first region of the object, and/or wherein the subsequent second parameter value is determined based at least in part on a physical requirement of the second region of the object.

15. The method of claim 1, wherein the first parameter value comprises a set of first parameter values, the set of first parameter values comprising a plurality of first parameter values respectively corresponding to respective ones of the plurality of irradiation parameters, and/or wherein the second parameter value comprises a set of second parameter values, the set of second parameter values comprising a plurality of second parameter values respectively corresponding to respective ones of the plurality of irradiation parameters.

16. The method of claim 1, wherein the first parameter value and/or the second parameter value are selected at least in part such that the alternating sequence comprises a first energy level deposited into the build material with respect to the first plurality of layers and a second energy level deposited into the build material with respect to the second plurality of layers, the first energy level differing from the second energy level.

17. The method of claim 1, wherein the first energy level differs from the second energy level in respect of one or more of the plurality of irradiation parameters comprises.

18. The method of claim 1, wherein the first energy level differs from the second energy level in respect of beam path and beam spot size, or wherein the first energy level differs from the second energy level in respect of beam intensity and beam spot size.

19. The method of claim 1, comprising:
irradiating the first plurality of layers and the second plurality of layers with an energy beam comprising a laser beam or an electron beam.

20. A system for additively manufacturing a three-dimensional object, the system comprising:
an irradiation device and a control system, wherein the control system is configured to cause the irradiation device to perform a method comprising:
irradiating a first plurality of layers of a build material to form a first portion an object in accordance with an irradiation parameter set comprising a plurality of irradiation parameters, wherein respective ones of the plurality of irradiation parameters respectively exhibit a first parameter value with respect to the first plurality of layers; and
irradiating a second plurality of layers of the build material to form a second portion of the object in accordance with the irradiation parameter set comprising the plurality of irradiation parameters, wherein respective ones of the plurality of irradiation parameters respectively exhibit a second parameter value with respect to the second plurality of layers;
wherein the first plurality of layers and the second plurality of layers are distributed in an alternating sequence across a height of the object, the alternating sequence comprising respective ones of the first plurality of layers followed by a respective one of the second plurality of layers; and
wherein the first parameter value differs from the second parameter value in respect of at least one of the plurality of irradiation parameters, wherein the plurality of irradiation parameters comprises: beam path, beam intensity and/or beam power.

* * * * *